(12) United States Patent
Kase et al.

(10) Patent No.: US 10,008,758 B2
(45) Date of Patent: Jun. 26, 2018

(54) INTEGRATED DIRECTIONAL COUPLER WITHIN AN RF MATCHING NETWORK

(71) Applicant: QUALCOMM Incorporated, San Diego, CA (US)

(72) Inventors: Kiyoshi Kase, Austin, TX (US); Marius Goldenberg, Austin, TX (US); Susanne A. Paul, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/194,315

(22) Filed: Jun. 27, 2016

(65) Prior Publication Data

US 2016/0359216 A1 Dec. 8, 2016

Related U.S. Application Data

(63) Continuation of application No. 13/841,278, filed on Mar. 15, 2013, now Pat. No. 9,379,678.

(60) Provisional application No. 61/637,238, filed on Apr. 23, 2012.

(51) Int. Cl.
| | |
|---|---|
| *H01P 1/18* | (2006.01) |
| *H03H 7/38* | (2006.01) |
| *H01P 5/18* | (2006.01) |
| *H03F 3/195* | (2006.01) |
| *H03F 1/56* | (2006.01) |
| *H03F 3/193* | (2006.01) |

(52) U.S. Cl.
CPC .............. *H01P 5/184* (2013.01); *H01P 5/185* (2013.01); *H01P 5/188* (2013.01); *H03F 1/565* (2013.01); *H03F 3/193* (2013.01); *H03F 3/195* (2013.01); *H03H 7/38* (2013.01); *H03F 2200/387* (2013.01); *H03F 2200/393* (2013.01); *H03F 2200/541* (2013.01); *Y10T 29/4902* (2015.01)

(58) Field of Classification Search
CPC ... H03H 7/48; H01P 5/18; H01P 5/184; H01P 5/185; H01P 5/187
USPC .................................. 333/109, 112, 115, 116
See application file for complete search history.

(56) References Cited

U.S. PATENT DOCUMENTS

| | | | |
|---|---|---|---|
| 5,530,922 A | 6/1996 | Nagode | |
| 5,742,210 A | 4/1998 | Chaturvedi et al. | |
| 6,972,640 B2 * | 12/2005 | Nagamori | H01P 5/185 333/109 |
| 7,151,421 B2 | 12/2006 | Shinabe et al. | |
| 7,183,888 B2 * | 2/2007 | Kanno | H01P 1/20381 336/200 |

(Continued)

*Primary Examiner* — Dean Takaoka
*Assistant Examiner* — Alan Wong
(74) *Attorney, Agent, or Firm* — Procopio, Cory, Hargreaves & Savitch LLP/Qualcomm

(57) ABSTRACT

A directional coupler utilizes an inductive element of a power amplifier and a coupled conductive element. The inductive element of the power amplifier is a functioning element within the power amplifier and at least part of the inductive element of the power amplifier is disposed in a multi-layer substrate. At least part of the coupled conductive element is disposed in the multi-layer substrate. The coupled conductive element is configured to be inductively coupled to the inductive element of the power amplifier such that the coupled conductive element carries a first RF signal that is representative of a second RF signal within the inductive element of the power amplifier.

13 Claims, 12 Drawing Sheets

(56) References Cited

U.S. PATENT DOCUMENTS

| | | | |
|---|---|---|---|
| 7,567,147 B2* | 7/2009 | Toujo | H01P 5/185 333/116 |
| 7,869,784 B2* | 1/2011 | Liu | H01P 5/185 455/252.1 |
| 8,249,544 B2* | 8/2012 | Okabe | H01P 5/184 327/219 |
| 8,324,979 B2 | 12/2012 | Cho | |
| 9,379,678 B2* | 6/2016 | Kase | H03F 3/195 |
| 2008/0070519 A1* | 3/2008 | Okabe | H01P 5/184 455/127.1 |
| 2011/0001576 A1 | 1/2011 | Lee et al. | |
| 2013/0307635 A1 | 11/2013 | Kase et al. | |

* cited by examiner

INTEGRATED DIRECTIONAL COUPLER WITHIN AN RF MATCHING NETWORK

CROSS-REFERENCE TO RELATED APPLICATION(S)

This application is a continuation of application Ser. No. 13/841,278, filed Mar. 15, 2013, which claims the benefit of provisional application No. 61/637,238, filed Apr. 23, 2012, entitled "Integrated Directional Coupler Within an RF Matching Network," all which are incorporated herein by reference.

BACKGROUND

Field of the Invention

This invention relates to RF systems and more particular to directional couplers.

Description of the Related Art

The physical implementation of radio frequency (RF) information transmission systems requires the amplification of the RF signal before it is injected into the communication channel. Examples of communication channels are free space in conjunction with antennas, coaxial cables, and wave guides. The amplification of the RF signal is provided by the RF power amplifier (PA). Many systems that include an RF power amplifier require sensing the amount of power generated at the output port of the PA for multiple reasons, e.g., power level control by way of feedback, reliability, and safety. A common approach to satisfying the requirement specified above is the addition of a directional coupler inserted between the RF PA output and the point of injection of the RF signal into the communication channel. The directional coupler siphons a very small but predictable portion of the RF signal destined for the communication channel and presents it to a dedicated port, the coupled port, where it is evaluated by other subsystems present in the system.

A directional coupler is an RF component typically comprising four signal ports: an input port, an output port, a coupled port, and an isolated port. FIG. 1 shows a portion of an RF system according to prior art. The output 9 of the RF power amplifier block 10 is coupled directly to the input port of the directional coupler. The output port of the directional coupler, node 3, is coupled to the input of the communication channel illustrated in FIG. 1 as resistor 6. The communication channel input impedance is usually the characteristic impedance of an RF transmission line, customarily 50-ohm. The directional coupler of FIG. 1 has the coupled port shown as node 4 and the isolated port shown as node 5. The isolated port, node 5, is connected to resistor 7, typically 50-ohm, illustrating either a physical resistor or in general terms, any port that presents an impedance appropriate for the described connection. When the PA injects RF signal power on node 9, a fraction, defined as the coupling ratio, of the RF power traveling towards the load 6, typically −20 dB (1%), appears at the coupled port 4. The directional coupler is designed such that the coupled port 4 presents a signal substantially representative of the RF power traveling from the PA 10 towards the load 6, while the isolated port 5 presents a signal substantially representative of the RF power traveling from the load 6 towards the PA 10. A significant figure of merit for the directional coupler is represented by the directivity of the coupler defined as the ratio of the power presented at the coupled port to the power presented at the isolated port, in the presence of a perfect impedance match at node 3.

As further shown in FIG. 1, the PA 10 includes an RF amplifier stage 1 and a matching network 2. The matching network 2 plays the role of an impedance transformation network, which converts the relatively high load impedance (e.g., 50-ohm) into a lower impedance (e.g., 5-ohm) as seen by the output of the final RF amplifier stage 1. It is common practice in the art to design the matching network to expect a load impedance on node 9 of 50-ohm. It is also common practice in the art to design the directional coupler 8 to expect a load impedance on node 3 of 50-ohm and further present an impedance of 50-ohm at node 9 so as to satisfy the 50-ohm expectation of the matching network 2. Moreover, the directional coupler is designed for 50-ohm impedances at the coupled port 4 and isolated port 5.

Various prior art embodiments have demonstrated the ability to construct the three parts shown in FIG. 1 within a PA module that satisfies the requirements set forth above. However, both the best achievable module performance and the smallest achievable physical dimensions of the module implementation are hampered by the rigid system partition depicted in FIG. 1.

SUMMARY

Accordingly, an embodiment provides an integrated directional coupler that includes an inductive element within a power amplifier to carry a first radio frequency (RF) signal and a coupled conductive element to carry a second RF signal. The inductive element of the power amplifier is part of a tuned matching network within the power amplifier. The coupled conductive element is configured to be electromagnetically coupled to the inductive element of the power amplifier such that the second RF signal is representative of the first RF signal.

In another embodiment an integrated directional coupler includes an inductive element within a power amplifier carrying a first radio frequency (RF) signal and a coupled conductive element carrying a second RF signal. The coupled conductive element is configured to be electromagnetically coupled to the inductive element of the power amplifier such that the second RF signal is representative of the first RF signal. The inductive element of the power amplifier has a first characteristic impedance that is different than a second characteristic impedance of said coupled conductive element.

In another embodiment a method of making a directional coupler includes forming at least a portion of an inductive element of a power amplifier in a multi-layer substrate, the inductive element being part of a tuned matching network within the power amplifier. The method further includes forming a conductive element in the multi-layer substrate, the conductive element configured to be electromagnetically coupled to the inductive element such that the conductive element carries a second radio frequency (RF) signal that is representative of a first RF signal within the inductive element.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
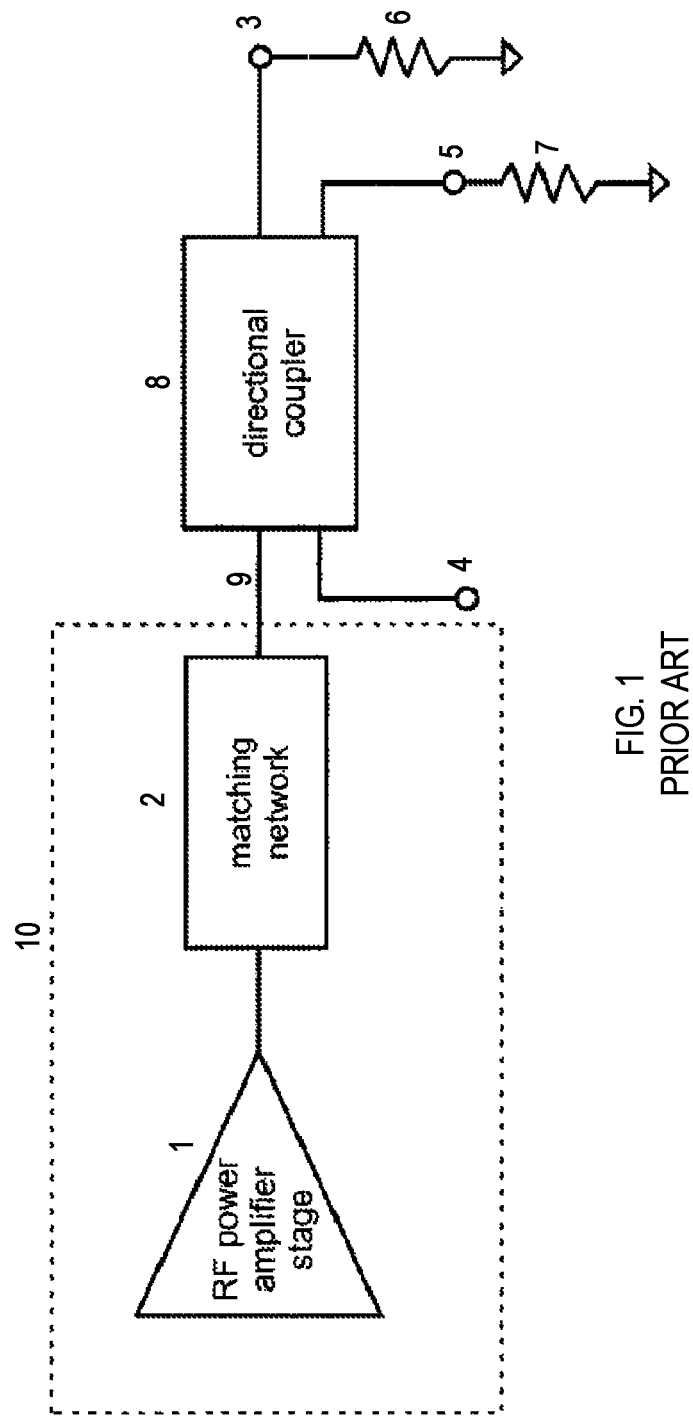
FIG. 1 illustrates a system with a directional coupler according to prior art.
Figure 2:
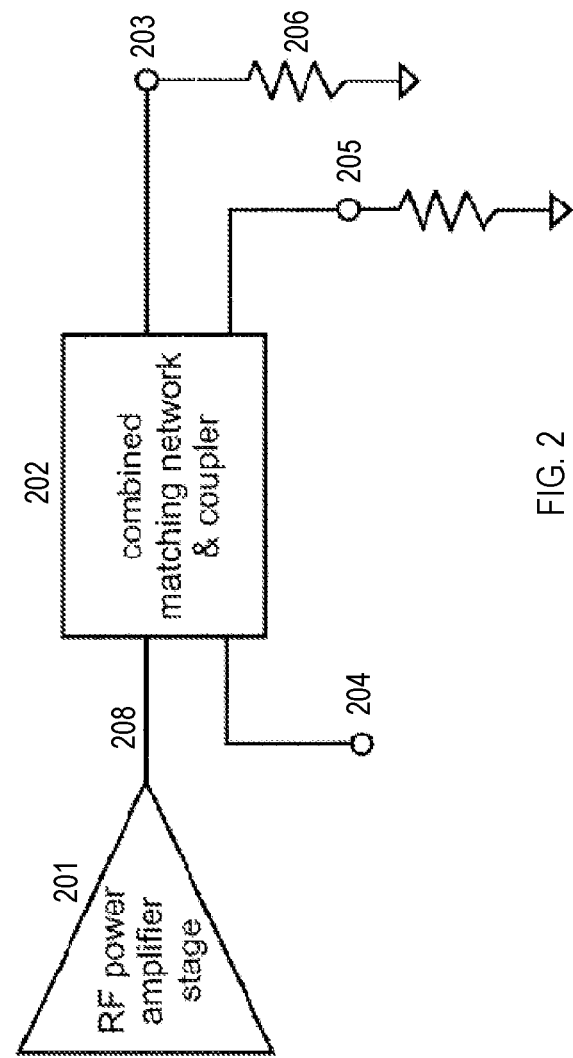
FIG. 2 illustrates a system partition in accordance with an embodiment of the present invention.

It is recognized in embodiments of this invention that a conceptual change of system partition to the one illustrated in FIG. 2 is highly desirable in that it will remove constraints freeing the designer to choose embodiments capable of superior RF performance and smaller physical dimensions than attainable otherwise. The relative freedom of design when implementing the system shown in FIG. 2 will become apparent from the detailed description of the embodiments of the invention as follows.

Figure 10A:
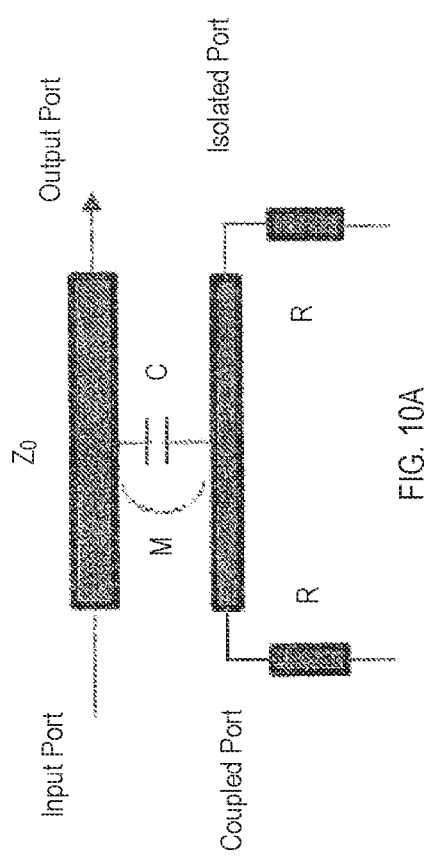
FIG. 10A illustrates an example of a lumped model for a directional coupler.
Figure 10B:
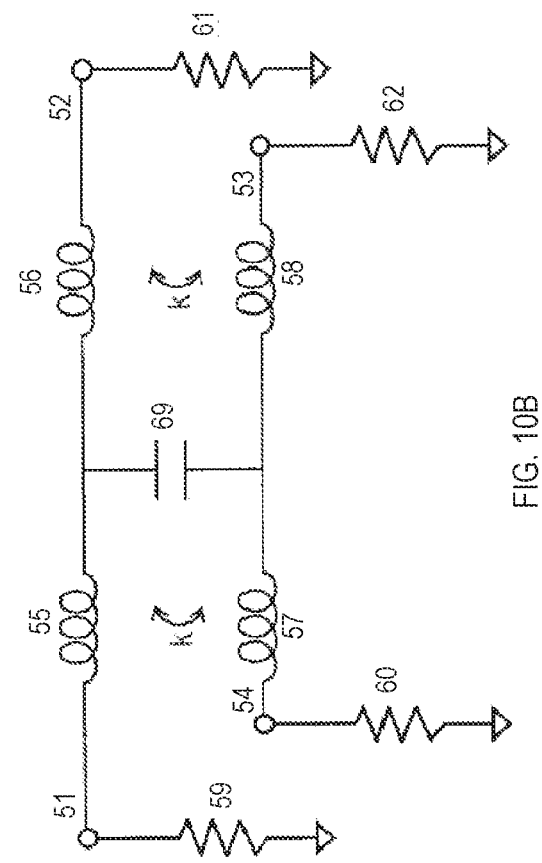
FIG. 10B illustrates a schematic representation of the lumped model for a directional.

The design process of directional couplers is well documented in the art. There are multiple ways to approach the directional coupler design. One example is to approach the design from a lumped model approximation of the directional coupler, which provides very simple closed form equations for the component values. FIGS. 10a and 10b show an example of a lumped model for a directional coupler named the C-M model, which stands for Capacitance-Mutual inductance model. FIG. 10a shows figuratively the directional coupler, wherein two conductive traces are in close proximity to each other so as to be capacitively coupled with capacitance C and magnetically coupled with mutual inductance M. The top trace is the main signal path through the directional coupler. The bottom trace is the coupled trace of the directional coupler, terminating on the coupled port and the isolated port, which are shown as connected to the termination resistors R. The characteristic impedance of the main signal path through the directional coupler is denoted as Zo.

FIG. 10b shows the schematic representation of the C-M lumped model of the directional coupler. Ports 51 and 52 are the input port and the output port of the main signal path, respectively. Ports 54 and 53 are the coupled port and the isolated port, respectively. The model further includes inductors 55, 56, 57, and 58 and capacitor 69. Inductor 55 and 57 are magnetically coupled to each other with the coupling factor k. Inductor 56 and 58 are magnetically coupled to each other with the coupling factor k. Resistors 59, 60, 61, and 62 are connected to the four ports of the directional coupler. In its simplest form, the C-M model uses identical inductors and termination resistors. For this simplified case the equations relating the component values to the directional coupler's characteristic impedance and expected termination resistors are:

$$C=k/\omega R$$

$$M=CRZo$$

Figure 11:
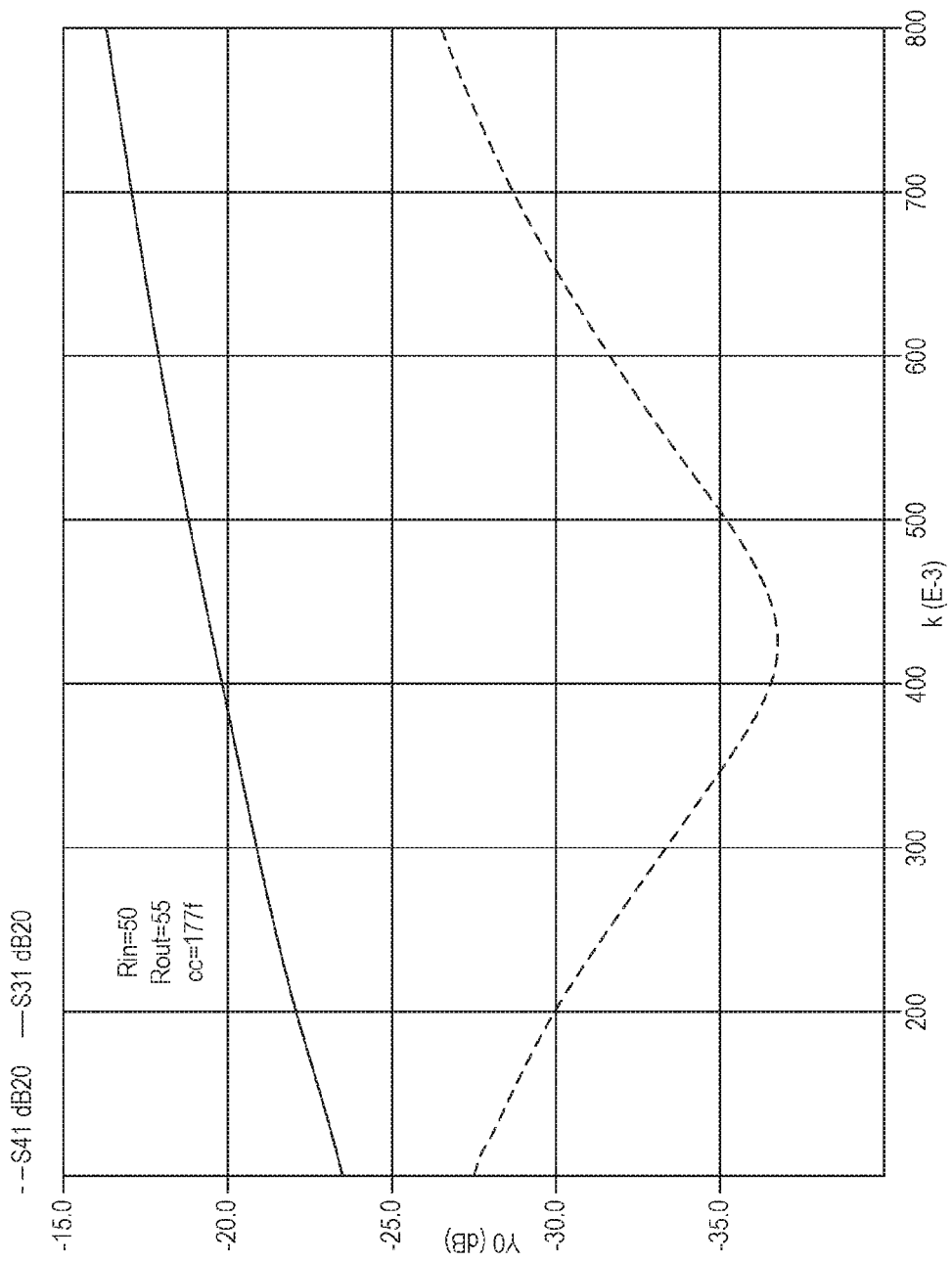
FIG. 11 illustrates how the choice of the coupling factor k affects the achieved coupling factor and directivity of the directional coupler.
Figure 12:
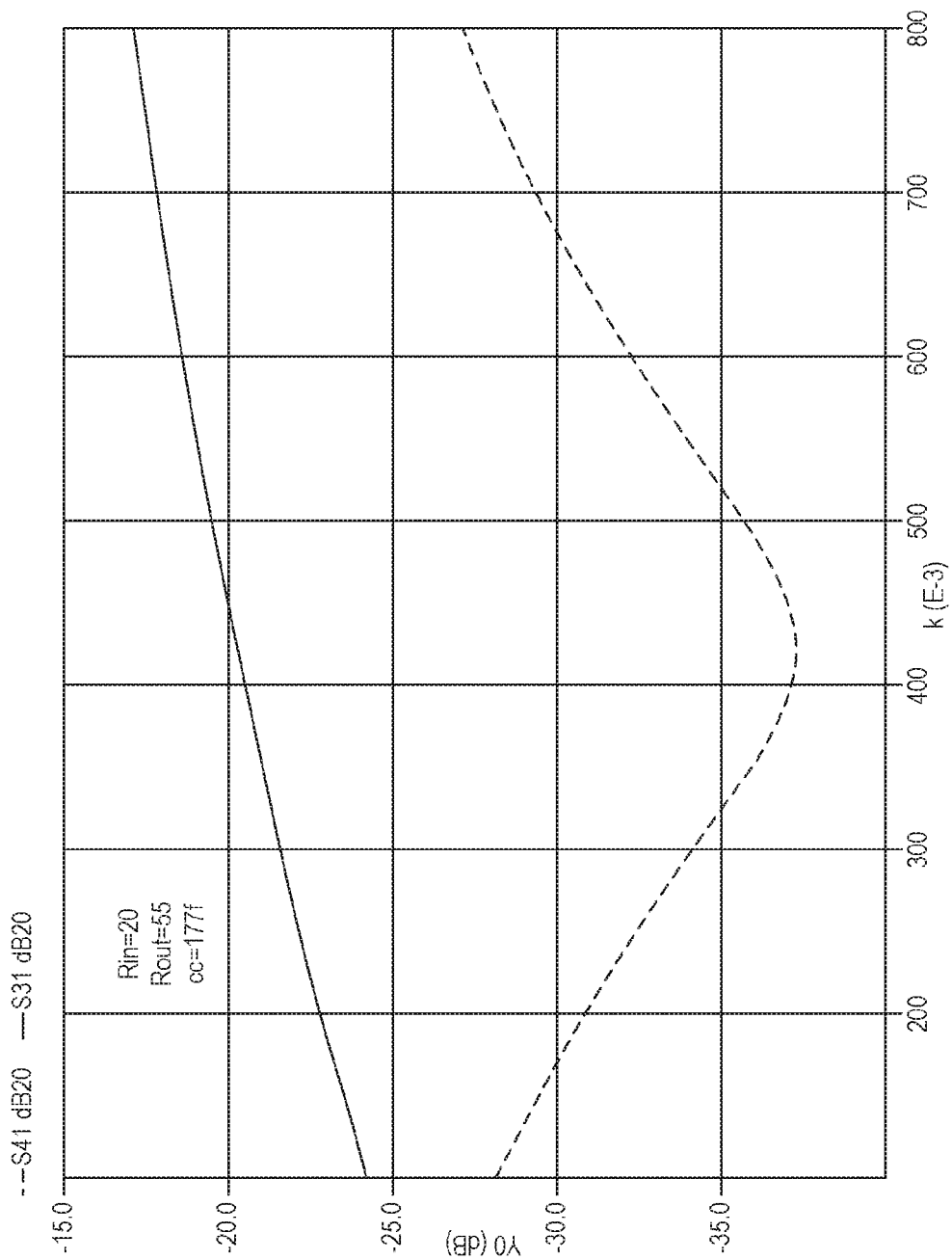
FIG. 12 illustrates how the choice of the coupling factor k affects the achieved coupling factor and directivity of the directional coupler.

The equations above show how the required characteristic impedance and termination resistors eliminate all but one degree of freedom for designing the directional coupler. For example, the remaining degree of freedom can be chosen to be the coupling factor, k. FIGS. 11 and 12 show how the choice of the k value strongly affects the achieved coupling factor and directivity of the directional coupler. As a result, even though k offers a degree of freedom to the designer, acceptable directional coupler performance can only be achieved for a very narrow range of K values, substantially constraining the design. Various embodiments of the present invention offer greater flexibility in that the choice of characteristic impedance for the coupler can be optimized in conjunction with optimization of the output matching network.

FIG. 2 shows the PA module system partition in accordance with an embodiment of the present invention. The RF amplifier stage 201 is coupled to the input 208 of the combined matching network and coupler block 202. It is known to those skilled in the art that matching networks comprise a plurality of impedances, at least one being an inductor. Any passive components associated with the final stage of the power amplifier can be considered part of the output matching network. Each matching network inductor presents with the opportunity to set up an electromagnetic coupling to a metal trace, henceforth referred to as the coupled trace of the integrated directional coupler, presenting ports, which will play the role of the coupled port and isolated port of the directional coupler of the prior art. In reference to FIG. 2, the coupled trace ports are node 204 as the coupled port, and node 205 as the isolated port. Furthermore, the output of the matching network, node 203, is coupled to the RF load 206. The system of FIG. 2 eliminates the requirement to design and implement a directional coupler that presents the standard 50-ohm impedance towards the matching network of a PA.

Figure 3:
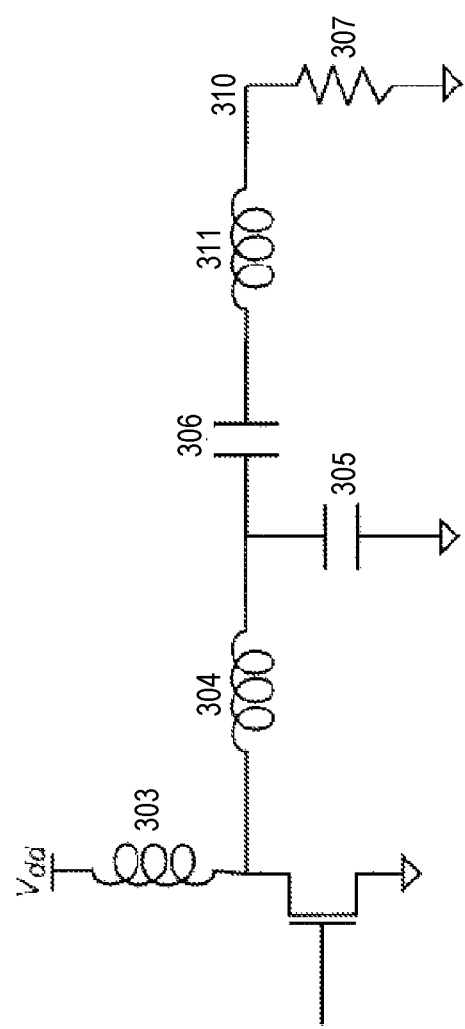
FIG. 3 illustrates an RF power amplifier stage and associated output match circuit.

FIG. 3 shows an example of an RF power amplifier stage and its associated output match circuit. The output match circuit includes elements 303, 304, 305, 306, and 311. The output 310 appears across load 307, figuratively shown as a resistor. In this power amplifier, any of the inductors, 303, 304, or 311 could be used as the inductive element of the integrated directional coupler. It should also be understood that a transformer comprises multiple inductors and therefore the inductive element to the integrated directional coupler could be an inductor that forms either a primary or a secondary coil of a transformer.

Figure 4:
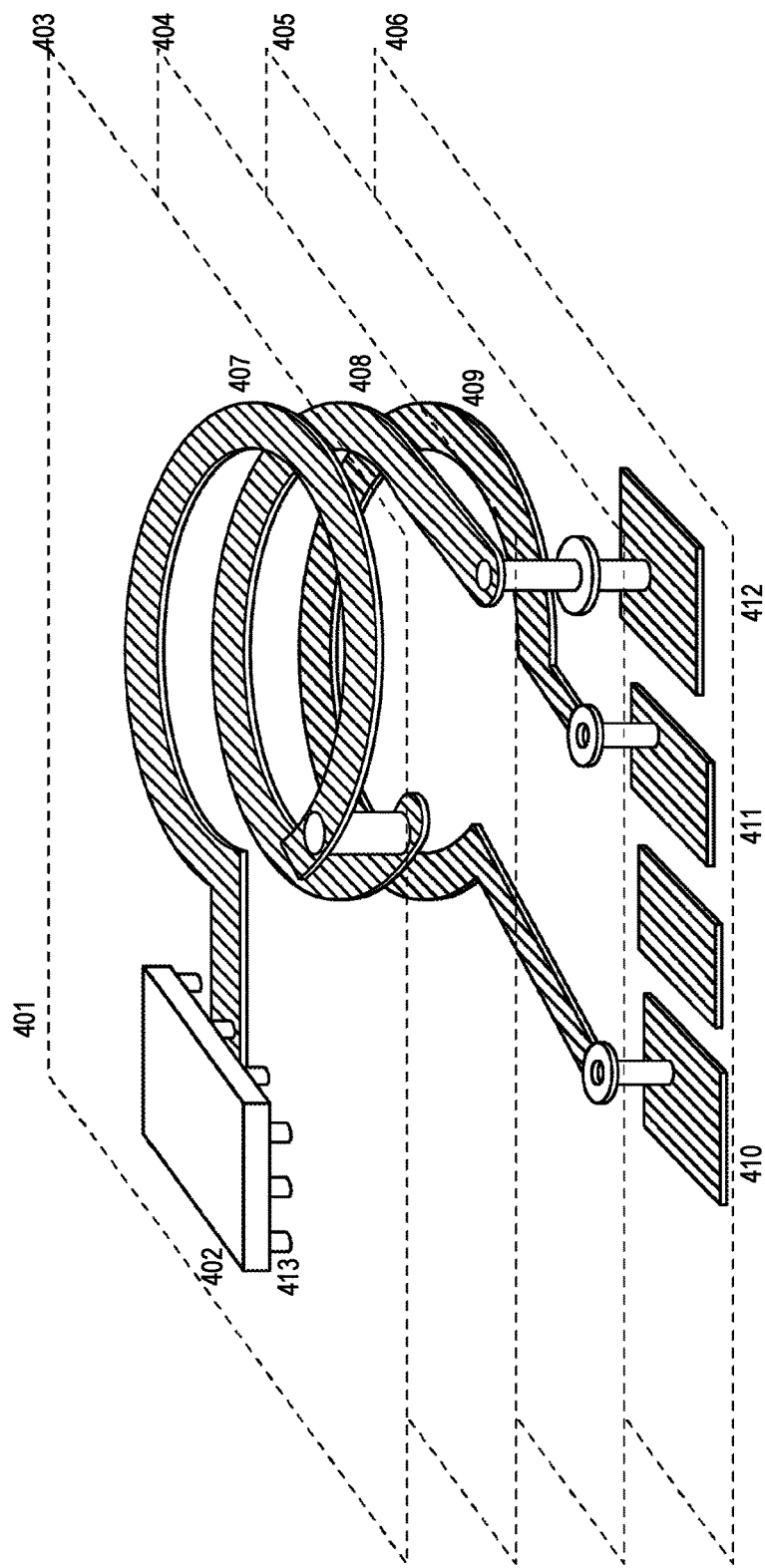
FIG. 4 illustrates a first embodiment of an integrated coupler in accordance with an embodiment of the present invention.

An example of a first embodiment of an integrated coupler is shown in FIG. 4. A power amplifier is built partly in die 402 and partly in multi-layer chip carrier substrate 401. The power amplifier could be built using any suitable technology for power amplifiers, including but not limited to CMOS or GaAs HBT. The multi-layer substrate could be built using any suitable material, including but not limited to Integrated Passive Device (IPD), ceramic, or either cored or coreless organic FR4. The multi-layer substrate comprises dielectric layers 403, 404, 405, and 406 and metal traces such as 407, 408, and 409. In the figure die 402 is flip chip mounted to substrate 401 using pillars 413 or solder bumps, however it should be understood that die 402 could also be wirebonded to substrate 401. The wire loops 407 and 408 form an inductor that is part of the output matching network of the power amplifier and is designed to resonate with other passive components on the die or in the substrate. The wire loop 409 forms the coupled trace of the integrated directional coupler. It has an isolated port on pad 411 and a coupled port on pad 410 on the bottom of the substrate. The length of the coupled trace and its proximity to the inductive element are chosen to give the desired coupling ratio. A longer trace and/or a closer trace will give a higher coupling ratio. The inductance of wire 409 and its magnetic coupling and capacitance to wire 408 are carefully tuned to give the desired characteristic impedance and to provide good directivity. The exact geometrical shape of the wire loops 407, 408, 409 is significant for the electrical parameters of the design however a variety of shapes can be used to achieve a desired target RF performance and embodiments of the invention are not limited to the circular shape shown in FIG. 4. By way of example a square, rectangular or octagonal shape wire or even a straight wire can be used instead of circles. The exact number of wire loops is significant for the electrical parameters of the design, however a variety of loop counts can be used to achieve a desired target RF performance and embodiments of the invention may have a count other than the count of two (2) shown in FIG. 4.

FIGS. 3 and 4 are intended to show that the integrated directional coupler of embodiments of the present invention utilizes an already existing inductor from within the PA to form the inductive element of the coupler. It should be understood that the present invention is not limited to this topology of power amplifier. Any other topology of RF power amplifier that contains inductors or transformers in its output matching network can be used as part of the invention.

Figure 5:
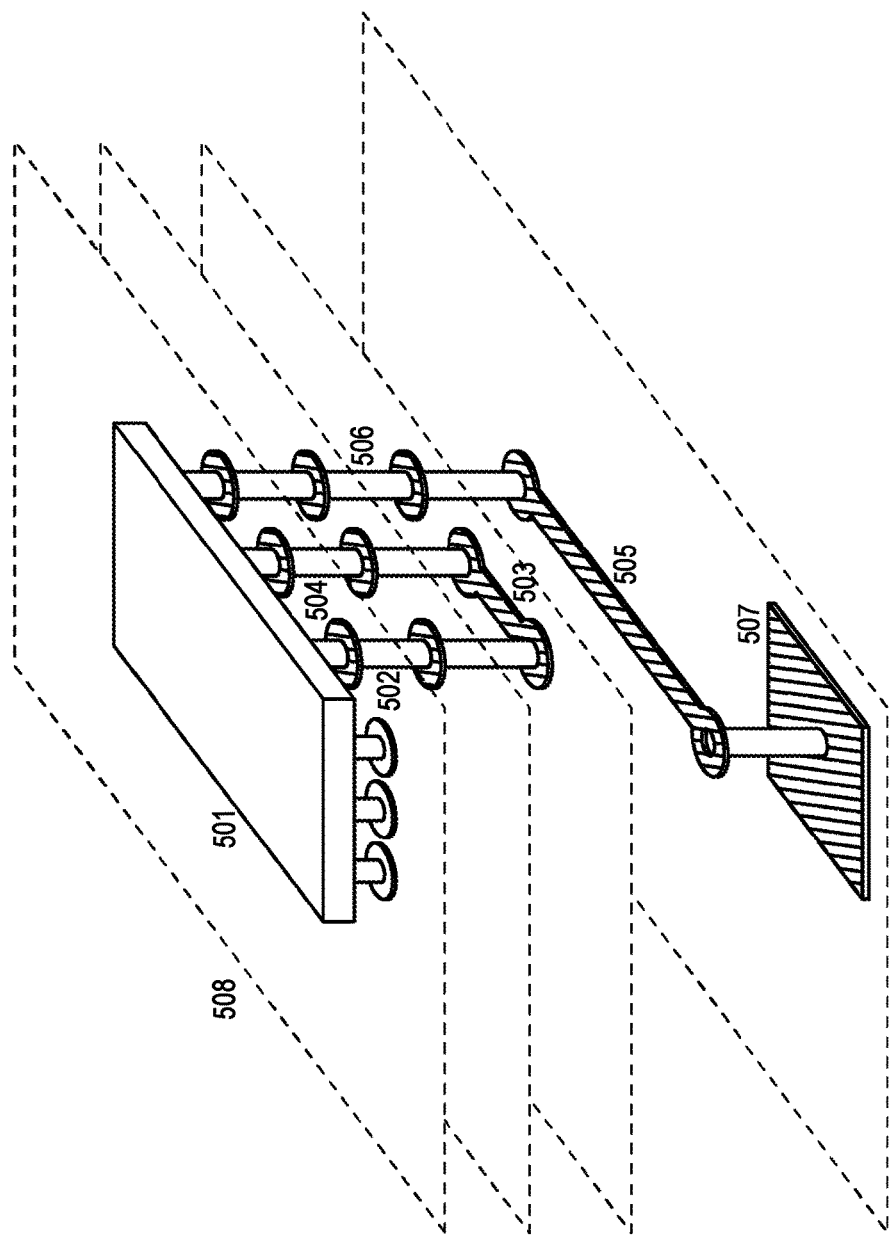
FIG. 5 illustrates another example of an integrated coupler of an embodiment of the present invention showing formation of the inductive element of the coupler.

FIG. 5 shows another example of an integrated coupler of an embodiment of the present invention wherein the inductive element of the coupler is formed from via stack 502, wire 503, and via stack 504. It originates on the die, where it connects to circuit elements, and returns back onto the die, where it connects to circuit elements. The coupled trace is formed from via stack 506 and wire 505 and connects to pad 507. It originates on the die, where it connects to circuit elements, runs near the inductive element of the coupler with an inductance, magnetic coupling, and capacitance that are carefully chosen to give the right combination of coupling ratio and directivity. The embodiment of FIG. 5 is an example where coupling is achieved through a combination of vertical coupling between segments 503 and 505 and of lateral coupling between segments 504 and 506. It should be understood that an integrated coupler of the present invention could also be formed using strictly lateral coupling by positioning two wires adjacent to one another on the same layer of metal.

Figure 6:
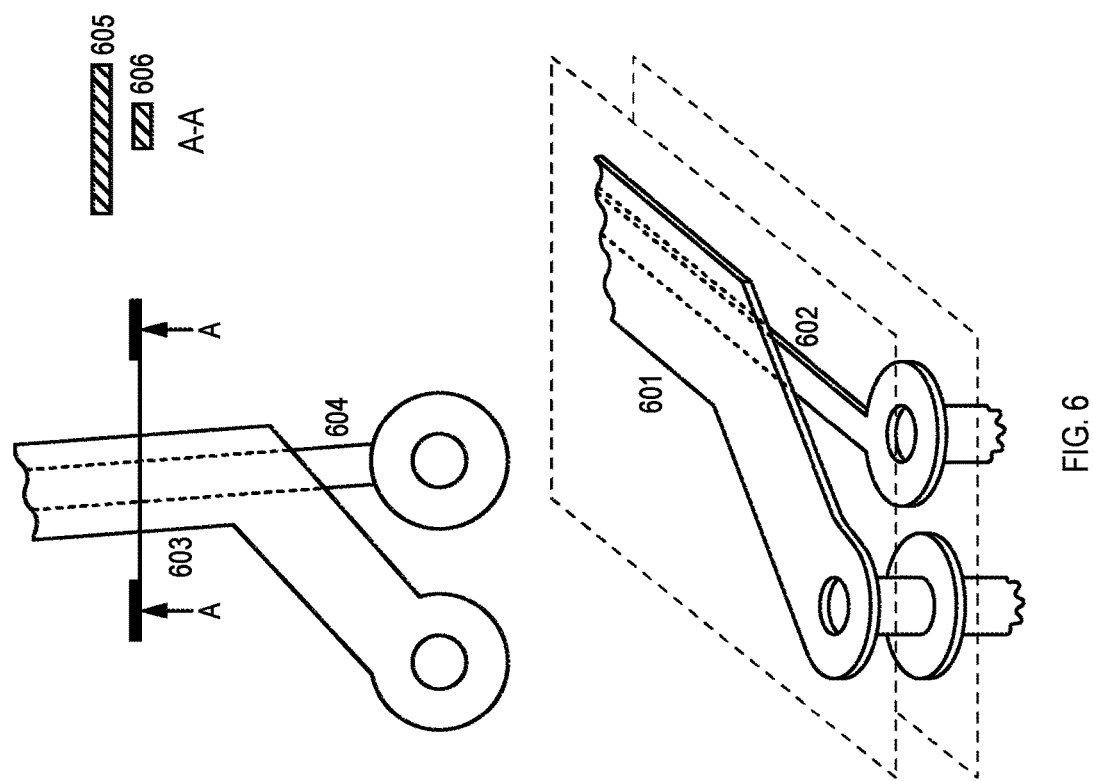
FIG. 6 illustrates an example of an integrated directional coupler that includes at least one inductive element of a power amplifier and a directional coupler trace in accordance with an embodiment of the present invention.

FIG. 6 shows an example of an integrated directional coupler of an embodiment of the present invention that includes at least one inductive element of a power amplifier and a directional coupler trace. The directional coupler trace carries an RF signal that is representative of the RF signal within the inductive element of the power amplifier. The inductive element of the power amplifier overlaps the directional coupler trace and the inductive element of the power amplifier has a different trace width and a different impedance than the directional coupler trace. In the figure, metal traces 601, 603, and 605 are different representations of the same metal trace. Metal traces 602, 604, and 606 are different representations of the same metal trace. Traces 601 and 602 are in a perspective view. Traces 603 and 604 are top views of traces 601 and 602, respectively. Traces 605 and 606 show a cross sectional view along the sectioning plane AA of traces 603 and 604, respectively. In this embodiment the coupled trace 602, 604, or 606 is substantially narrower than metal trace 601, 603, or 605, where metal trace 601, 603, or 605 are part of the matching network inductive element chosen to be employed as the inductive element of the coupler. Metal traces 601 and 602 reside on adjacent substrate layers and lay parallel to each other for at least part of their respective length.

Figure 7:
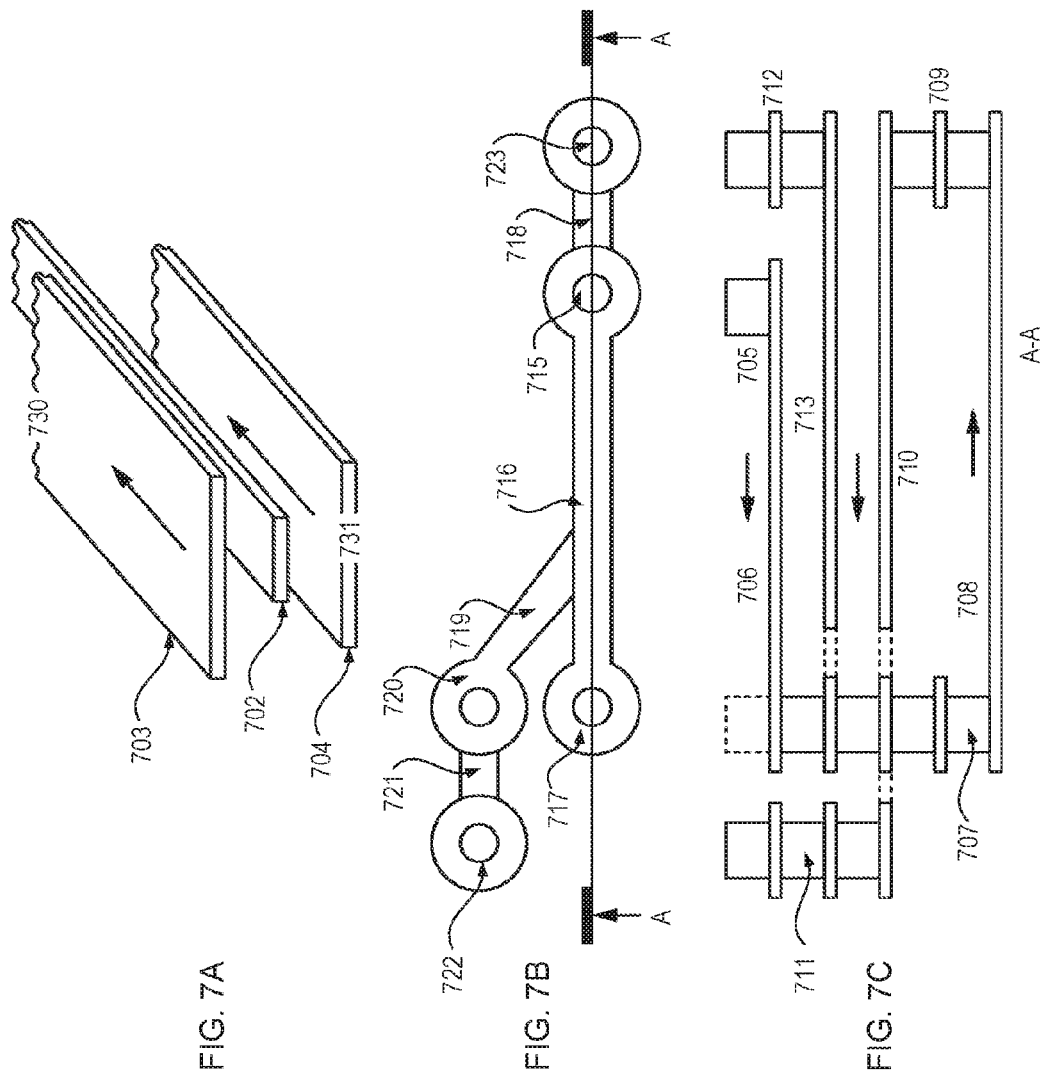
FIG. 7A illustrates an example of an integrated directional coupler that includes at least one inductive element of a power amplifier and a directional coupler trace in accordance with an embodiment of the present invention.
FIG. 7B illustrates a top view of an example of a substrate metal arrangement that satisfies the flow direction imposed in FIG. 7a in accordance with an embodiment of the present invention.
FIG. 7C illustrates a cross section view of an example of substrate metal arrangement that satisfies the flow direction imposed in FIG. 7a in accordance with an embodiment of the present invention.

FIG. 7 shows an example of an integrated directional coupler of an embodiment of the present invention that includes at least one inductive element of a power amplifier and a directional coupler trace. The directional coupler trace carries an RF signal that is representative of the RF signal within the inductive element of the power amplifier. The directional coupler trace is sandwiched between two segments of the inductive element of the power amplifier. As illustrated in FIG. 7a, the coupled trace 702 is sandwiched between metal trace 703 and metal trace 704, wherein metal trace 703 and 704 are part of the inductive element of the directional coupler, and where traces 702, 703, and 704 are located on three adjacent substrate layers. The RF current traversing traces 703 and 704 of the inductive element flows in the same direction in both wires 703 and 704 as exemplified by the arrows in FIG. 7a. This is accomplished by providing a path, not shown in FIG. 7a, that allows current exiting the figure at point 730 to return to the figure at point 731.

FIGS. 7b and 7c show an example of substrate metal arrangement that satisfies the flow direction imposed in FIG. 7a. FIG. 7b and FIG. 7c represent two views of the same metal structure. FIG. 7b is the top view and FIG. 7c is the cross section along the plane AA depicted in FIG. 7b. The inductive element comprises via 705, trace 706, via stack 707, trace 708, via stack 709, trace 710, and via stack 711 as shown in FIG. 7c. The same inductive element is shown in FIG. 7b as comprising via 715, trace 716, via stack 717, trace 721, and via stack 722. All other metal parts of the inductive element are hidden from view in FIG. 7b. The coupled trace comprises via stack 712 and trace 713 as shown in FIG. 7c. The same coupled trace appears as via stack 723, trace 718, trace 719, and via stack 720 in FIG. 7b. Traces 718 and 719 are on the same layer. Via stack 720 has no visible counterpart in FIG. 7c.

Figure 8:
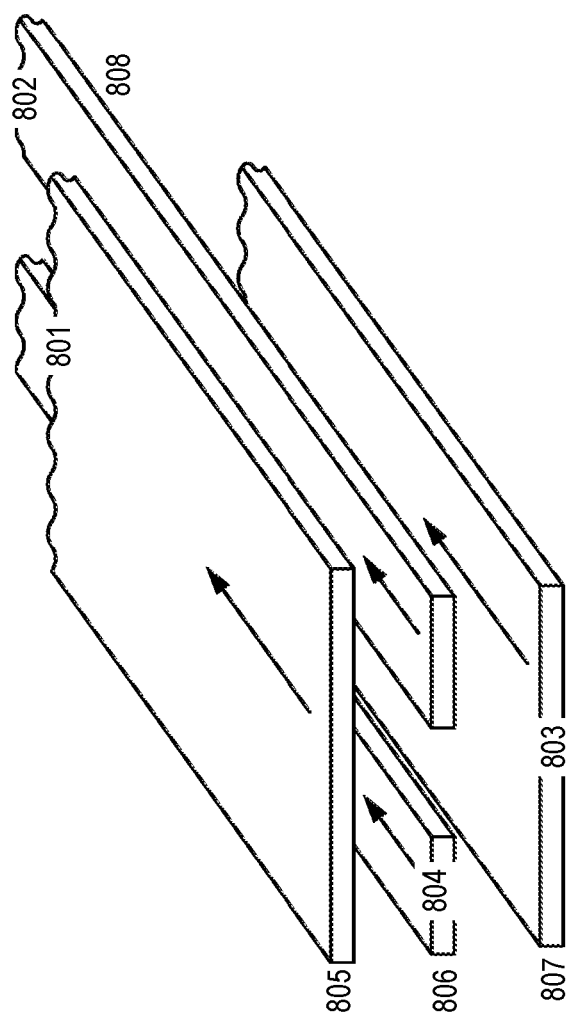
FIG. 8 illustrates an example of an integrated directional coupler according to an embodiment of the present invention that includes at least one inductive element of a power amplifier and a directional coupler trace.

FIG. 8 shows an example of an integrated directional coupler of an embodiment of the present invention that includes at least one inductive element of a power amplifier and a directional coupler trace. The directional coupler trace carries an RF signal that is representative of the RF signal within the inductive element of the power amplifier. The inductive element of the power amplifier overlaps two turns of the directional coupler trace. The coupled trace comprises two metal traces, 806 and 808, sandwiched between metal traces 805 and 807, where metal traces 805 and 807 are part of the inductive element of the directional coupler, and where traces 805, 806, 807 are located on three adjacent substrate layers and where traces 806 and 808 lie on the same substrate layer. The RF current traversing traces 805 and 807 of the inductive element is arranged so that it flows in a direction as shown by the arrows in FIG. 8. This is accomplished by providing a path, not shown in FIG. 8, that allows current exiting the figure at point 801 to return to the figure at point 803 and a second path, not shown in FIG. 8, that allows current exiting the figure at point 802 to return to the figure at point 804.

Figure 9:
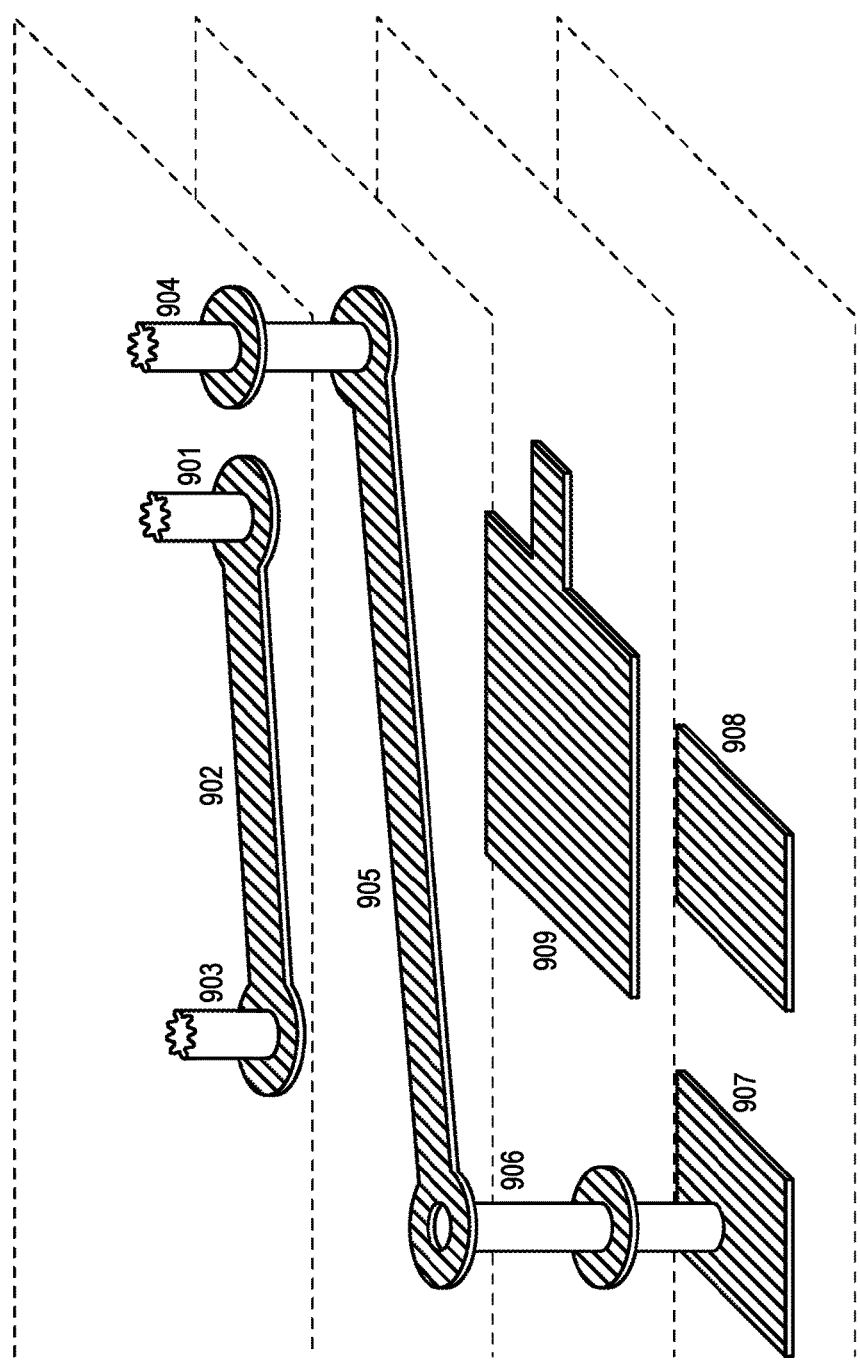
FIG. 9 illustrates an example of an integrated directional coupler according to an embodiment of the present invention that includes at least one inductive element of a power amplifier and a directional coupler trace.

FIG. 9 shows an example of an integrated directional coupler of an embodiment of the present invention that includes at least one inductive element of a power amplifier and a directional coupler trace. The directional coupler trace carries an RF signal that is representative of the RF signal within the inductive element of the power amplifier. The inductive element of the power amplifier overlaps the directional coupler trace and one or more shields are located within the substrate to shield said directional coupler trace from undesired signals and to tune the impedance present on the directional coupler trace. In FIG. 9, the coupled trace comprises via 901, trace 902, via 903, and pad 908. Pad 908 is connected to the coupled trace by means of a conductive path elsewhere in the substrate and not shown in the figure. The inductive element of the PA comprises via stack 904, trace 905, via stack 906, and bottom pad 907. The metal structure 909 forms a shield, which reduces the capacitive coupling between pad 908 of the coupled trace and segment 905 of the inductive element. At the same time, the additional capacitance between pad 908 and shield 909 adjusts the tuning of the coupled trace. These effects can be used to improve the directivity of the coupler.

The integrated directional coupler embodiments described above are shown to be built in a chip carrier substrate. That approach allows the inductive element and the coupled trace to both be built with high Q in a substrate and the size of these elements also makes them well suited for a substrate. However, it should be understood that an integrated directional coupler of an embodiment of the present invention could also be built on a power amplifier die. In such an embodiment at least part of the coupling between the inductive element and coupled trace would occur on the die. The structure would otherwise be similar to those shown in the figures above.

Thus, embodiments have been described capable of superior RF performance and smaller physical dimensions. The description of the invention set forth herein is illustrative, and is not intended to limit the scope of the invention as set forth in the following claims. Other variations and modifications of the embodiments disclosed herein may be made based on the description set forth herein, without departing from the scope of the invention as set forth in the following claims.

What is claimed is:

1. An integrated directional coupler, comprising:
   an input port;
   an output port;
   an isolated port;
   a coupled port;
   an inductive element coupled with a power amplifier disposed on a first dielectric layer of multilayer substrate, wherein the inductive element is coupled between the input port and the output port, and wherein the inductive element includes a first wire loop and a third wire loop coupled in series with the first wire loop; and
   a coupled conductive element coupled between the isolated port and the coupled port, wherein the coupled conductive element is electromagnetically coupled to the inductive element such that a signal at the coupled port is representative of a signal output by the power amplifier, and wherein the coupled conductive element includes a second wire loop,
   wherein the first wire loop is separated from the third wire loop by a first dielectric layer and the second wire loop is separated from the third wire loop by a second dielectric layer,
   wherein the first wire loop is disposed on the first dielectric lever of the multilayer substrate, wherein the third wire loop is disposed between the first dielectric layer and a second dielectric layer immediately below the first dielectric layer of the multilayer substrate, and wherein the second wire loop is disposed on the second dielectric layer of the multilayer substrate.

2. The integrated directional coupler of claim 1, wherein the first wire loop and the second wire loop are circular.

3. The integrated directional coupler of claim 1, wherein the power amplifier is at least partially disposed in an integrated circuit die mounted to an upper surface of the first dielectric layer of the multilayer substrate.

4. The integrated directional coupler of claim 3, further comprising:
   a first pad coupled to the isolated port; and
   a second pad coupled to the coupled port,
   wherein the first pad and the second pad are disposed on a bottom surface of the multilayer substrate.

5. The integrated directional coupler of claim 4, further comprising a third pad coupled to the output port, wherein the third pad is disposed on the bottom surface of the multilayer substrate.

6. The integrated directional coupler of claim 5, wherein a first end of the second wire loop is coupled to the first pad by a first via, wherein a second end of the second wire loop is coupled to the second pad by a second via, wherein an end of the first wire loop is coupled to a first end of the third wire loop by a third via, and wherein a second end of the third wire loop is coupled to the third pad by a via stack.

7. A radio-frequency matching network and integrated directional coupler, comprising:
   a tuned matching network having an inductive element to carry a first radio-frequency signal, the inductive element including a first wire loop and a third wire loop coupled in series with the first wire loop; and
   a coupled conductive element configured to carry a second radio-frequency signal, the coupled conductive element including a second wire loop electromagnetically coupled to the first wire loop such that the second radio-frequency signal is representative of the first radio-frequency signal from a power amplifier,
   wherein the first wire loop is separated from the third wire loop by a first dielectric layer and the second wire loop is separated from the third wire loop by a second dielectric layer,
   wherein the power amplifier is disposed on the first dielectric layer, and wherein the first wire loop is disposed on the first dielectric layer and is coupled to the power amplifier, wherein the third wire loop is disposed between the first dielectric layer and the second dielectric layer immediately below the first dielectric layer, and wherein the second wire loop is disposed on the second dielectric layer of the multilayer substrate.

8. The radio-frequency matching network and integrated directional coupler of claim 7, wherein the tuned matching network is an output match circuit of the power amplifier.

9. The radio-frequency matching network and integrated directional coupler of claim 8, wherein the first wire loop and the third wire loop coupled in series with the first wire loop are configured to resonate with at least one other passive component.

10. The radio-frequency matching network and integrated directional coupler of claim 7, wherein at least part of the inductive element is disposed in a multilayer substrate and wherein at least part of the coupled conductive element is disposed in the multilayer substrate.

11. The radio-frequency matching network and integrated directional coupler of claim 10, wherein an output of the power amplifier is coupled to the first wire loop.

12. The radio-frequency matching network and integrated directional coupler of claim 11, wherein the power amplifier is disposed in an integrated circuit die mounted to the multilayer substrate.

13. The radio-frequency matching network and integrated directional coupler of claim 7, wherein the first wire loop and the second wire loop are circular.

\* \* \* \* \*